United States Patent [19]

Kay

[11] Patent Number: 5,301,123
[45] Date of Patent: Apr. 5, 1994

[54] ZERO CROSSING BASED SPECTRUM ANALYZER AND METHOD

[75] Inventor: Steven M. Kay, Middletown, R.I.

[73] Assignee: Board of Governors for Higher Education, State of Rhode Island and Providence Plantations, Providence, R.I.

[21] Appl. No.: 925,459

[22] Filed: Aug. 11, 1992

Related U.S. Application Data

[63] Continuation-in-part of Ser. No. 472,426, Jan. 30, 1990, abandoned.

[51] Int. Cl.⁵ .............................................. G01R 23/15
[52] U.S. Cl. ..................................... 364/485; 364/553
[58] Field of Search ................. 324/76.31; 364/553, 364/485

[56] References Cited

U.S. PATENT DOCUMENTS

| | | | |
|---|---|---|---|
| 3,626,168 | 12/1971 | Norsworthy | 364/553 |
| 3,878,724 | 4/1975 | Allen | 364/553 |
| 3,881,097 | 4/1975 | Lehmann et al. | |
| 3,984,669 | 10/1976 | Lehmann et al. | |
| 4,286,326 | 8/1981 | Houdard | |
| 4,358,733 | 11/1982 | Hanahara | |
| 4,640,134 | 2/1987 | Simmons | 324/76.31 |

OTHER PUBLICATIONS

Comparison of Zero-Crossing Counter to FFT Spectrum of Ultrasound Doppler-Cote et al.-1988 (no month), pp. 498-502.

Primary Examiner—Kevin J. Teska
Assistant Examiner—Thomas Peeso
Attorney, Agent, or Firm—Samuels, Gauthier & Stevens

[57] ABSTRACT

A zero crossing based spectrum analyzer, a method that samples zero crossings of a signal waveform containing only real zeros and uses this information to determine the discrete Fourier Transform coefficients, is disclosed. A band-limited signal represented by real and complex zeros is converted by invertible techniques to a signal that contains only real (physical) zeros. This converted signal is applied as the input signal to the zero crossing based spectrum analyzer.

4 Claims, 2 Drawing Sheets

BLOCK DIAGRAM OF THE SPECTRUM ANALYZER

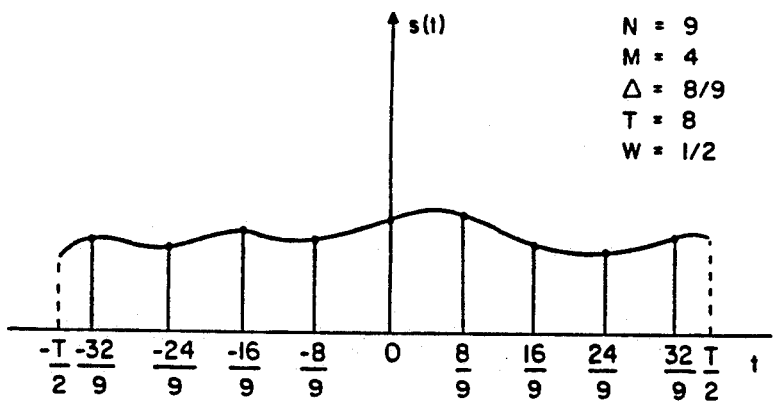
FIG. 1: EXAMPLE OF THE SIGNAL s(t) UNDER CONSIDERATION
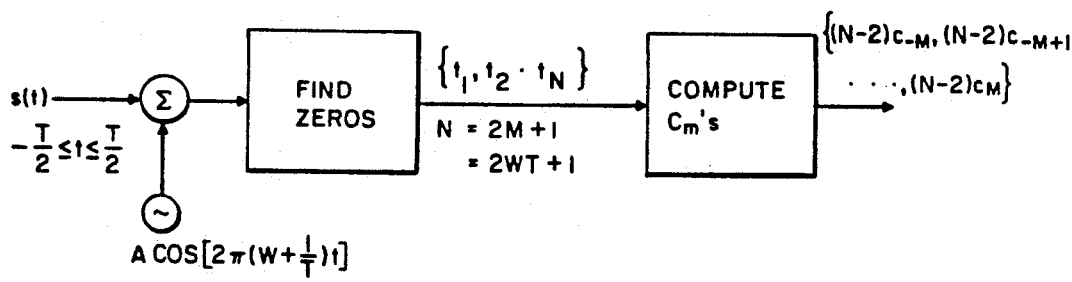
FIG. 3: FUNCTIONAL BLOCK DIAGRAM OF THE SPECTRUM ANALYZER
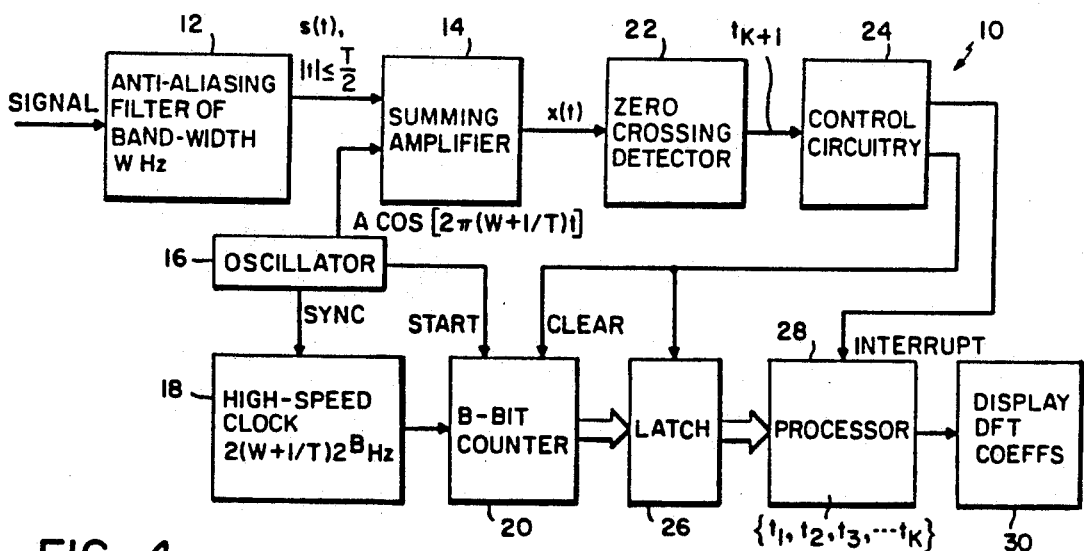
FIG. 4: BLOCK DIAGRAM OF THE SPECTRUM ANALYZER

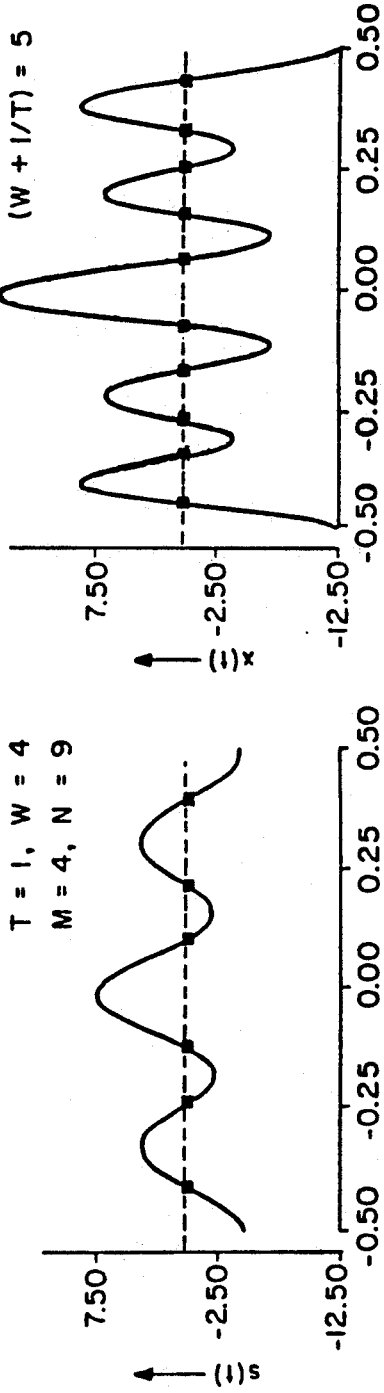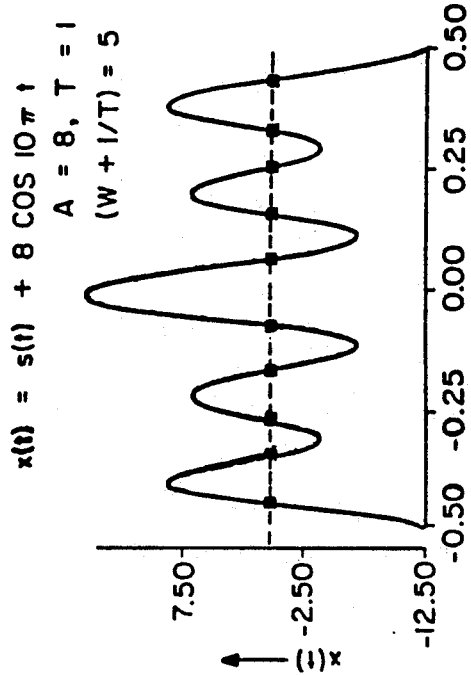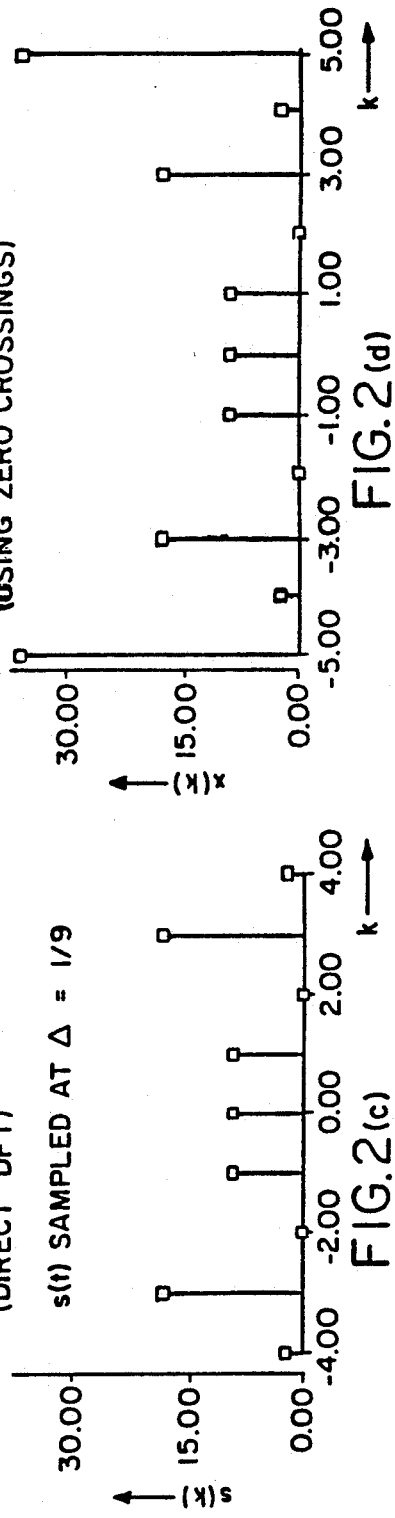
FIG. 2: ILLUSTRATION OF ZERO CROSSING EXTRACTION AND DFT EVALUATION

ZERO CROSSING BASED SPECTRUM ANALYZER AND METHOD This is a continuation-in-part of copending application(s) Ser. No. 07/472,426 filed on Jan. 30, 1990 now abandoned.

BACKGROUND OF THE INVENTION

This invention relates to spectrum analyzers in general and, more specifically, to a zero crossing based spectrum analyzer and method for determining the Discrete Fourier Transform (DFT) of a signal from the zero axis crossings of the signal rather than from its uniform (amplitude) samples.

Spectrum analyzers are employed in most of the modern signal processing systems for measuring the distribution of signal energy in frequency. Conventional digital spectrum analyzers consist of an anti-aliasing filter to band-limit the signal, an A/D converter to represent the analog signal by a sequence of numbers and a software based Fast Fourier transformer to compute the Discrete Fourier Transform. The conventional A/D converter method relies on multi-level quantization of samples taken at prescribed instants of time and requires a relatively high degree of hardware complexity. It is, accordingly, a general object of the invention to provide an improved apparatus and method for determining the DFT of a signal.

It is a specific object of the invention to provide a zero based spectrum analyzer for determining the DFT coefficients of the signal from the zero axis crossings of the signal rather than from its uniform (amplitude) samples.

It is another object of the invention to provide a spectrum analyzer that does not utilize an A/D converter.

It is a feature of the invention that signal sampling and quantization are eliminated.

It is another feature of the invention that since the A/D converter is avoided, the spectrum analyzer does not suffer from dynamic range problems and speed limitations.

It is a further feature of the invention that hardware complexity is reduced because the zero based spectrum analyzer and method of the present invention employs a zero crossing detector, a high-speed clock, a converter, control circuitry and a processor for converting the zero crossings into DFT coefficients.

BRIEF DESCRIPTION OF THE INVENTION

A zero crossing based spectrum analyzer is a method for determining the Discrete Fourier Transform (DFT) from the zero crossings of a signal waveform. The signal waveform contains only real zeros and, if required, a band-limited signal represented by real and complex zeros is converted by invertible techniques to a signal that contains only real i.e. physical zeros.

The objects and features mentioned above and other objects and features with the invention will best be understood from a detailed description of a preferred embodiment thereof selected for purposes of illustration and shown in the accompanying drawings, in which:

FIG. 1 is a diagram showing the sampling of the signal s(t);

FIGS. 2a-2d illustrate the zero crossing extraction and DFT evaluation;

FIG. 3 is a functional block diagram of the zero crossing based spectrum analyzer; and FIG. 4 is a block diagram of the zero crossing based spectrum analyzer.

DETAILED DESCRIPTION OF THE INVENTION

Before discussing the hardware configuration and apparatus of the zero crossing based spectrum analyzer, it will be helpful in understanding the invention to summarize the theory associated with zero crossings sampling and show that the DFT can be directly evaluated from the zero crossings and identify the conditions under which the representation is valid. Thereafter, the computational algorithms for evaluating the DFT coefficients from the zero crossings are described.

1. Zero Crossing Sampling Theory and DFT From Zeros

A band-limited signal can be represented by a set of amplitude sample values taken at the Nyquist rate. The sampling theorem can be generalized to include non-uniform sampling and the use of derivatives of the signal. Yet another way of representing such signals is by means of their real and complex zeros. A zero based representation is valid when the signals satisfy conditions such as finite energy, boundedness and finite power; these restrictions are met by the signals of interest, viz, the band-limited signals. Often, however, the process of determining the zero sequence which corresponds to a given waveform may not be trivial. The real zeros of the waveform are its conventional zero axis crossings and are easy to determine by clipping. Usually the complex zeros are not easy to identify, except through a numerical factorization of a trigonometric polynomial. An alternative procedure is to preprocess the signal prior to the zero extraction by means of an invertible transform which converts all the complex zeros into first-order real zeros. In the case of periodic band-limited signals, signal recovery from the zero crossing sequence is straightforward using a product expansion. For aperiodic signals which are represented by an infinite product, the signal can only be approximately recovered and therefore, the following discussion will be limited to periodic band-limited signals.

2. Product (Zero Based) Representation for Periodic Band-limited signals

Consider the band-limited real signal s(t) observed over the interval $-T/2 \leq t < T/2$. Let W be the single sided bandwidth and assume that s(t) repeats itself outside the interval T, the same assumption implicit in the use of DFT for spectral analysis. Aperiodic signals can be considered as the limiting case when $1/T \to 0$. Now the real periodic signal s(t) can be expressed in terms of its Fourier series expansion as $$s(t) = \sum_{m=-M}^{M} C_m e^{jm\omega_0 t} \quad (1)$$

where $$\omega_0 = \frac{2\pi}{T}; \; c_{-m} = c_m^*; \; M = \frac{2\pi W}{\omega_0} = WT$$

s(t) can be identified to be a 2Mth degree polynomial in $e^{j\omega_0 t}$. Now allow the argument t to assume complex values say, $t \to \xi = t + j\sigma$. Further let $Z = e^{j\omega_0 \xi}$. Then $$s'(Z) = \sum_{m=-M}^{M} c_m Z^m \quad (2)$$

The 2M zeros of $s'(Z)$ are given by $$Z_i = e^{j\omega_o \xi_i}, \ i = 1, 2, \ldots, 2M$$
$$= e^{j\omega_o(t_i + j\sigma_i)}$$

The actual axis crossing zeros of $s(t)$ are the real zeros for which $\xi_i = t_i$ (or $Z_i = e^{j\omega_o t_i}$, $\sigma_i = 0$) and the complex zeros of $s(t)$ are the ones for which $\xi_i = t_i + j\sigma_i$ for $\sigma_i \neq 0$. It can be shown that any complex zeros $\xi_i$ must occur in complex conjugate pairs.

Note that $s(t)$ has $2M = 2WT$ zero crossings in period T. Thus, the zero count is equal to the "dimensionality" of the signal 2WT, and it is reasonable to regard the coordinates of the zeros as the informational attributes of $s(t)$, as are the Nyquist samples or the Fourier coefficients.

If we assume that our $s(t)$ has only real zeros (or all the complex zeros have been preprocessed to real zeros by means of a suitable invertible transformation), then the original signal $s(t)$ can be reconstructed from its real zero crossings $t_i$ and knowledge of $c_M$ as $$s(t) = 2^{2M} |c_M| \prod_{i=1}^{2M} \sin\left[\frac{\omega_o}{2}(t - t_i)\right] \quad (3)$$

If $|c_M|$ is unknown, the $s(t)$ may be reconstructed to within a scale factor. Also, then the polynominal $s'(Z)$ can be written as $$\frac{s'(Z)}{c_M} = Z^m + \frac{c_{M-1}}{c_M} Z^{M-1} + \ldots + \frac{c_{-M}}{c_M} Z^{-M} \quad (4)$$

$$= Z^{-M} \prod_{i=1}^{2M} (Z - Z_i)$$

$$= Z^{-M} \prod_{i=1}^{2M} (Z - e^{j\omega_o t_i})$$

With the knowledge of $c_M$ and the axis crossings $t_i$'s, the Fourier coefficients $c_m$'s can be found by equating the coefficients of the powers of Z in (2) and (4).

Once the Fourier coefficients have been found, the DFT coefficients follow easily. Assume that we wish to determine the DFT coefficients of the sequence $s(n\Delta)$ for $n = -M, \ldots, O, \ldots, M$ and where $1/\Delta = 2W + 1/T$ (about the Nyquist rate). See FIG. 1 for an example of the sampling. Then it is easy to show that the DFT coefficients $S(k)$ of the Nyquist samples of $s(t)$ are related to the Fourier series coefficients $c_m$'s as $$S(k) = N c_k, \ k = -M, \ldots, O, \ldots, M \quad (95)$$

where $N = 2M + 1$ is the DFT length. The DFT is defined as $$S(k) = \sum_{n=-M}^{M} s(n\Delta) e^{-j(2\pi kn/N)} \quad (6)$$

-continued
$$k = -M, \ldots, O, \ldots M$$

where $N = 2M + 1 = 2WT + 1 = T/\Delta$. Therefore, the DFT coefficients can be evaluated from the zero crossings of the signal using (4) and (5).

For the sake of illustration, consider the simple signal $s(t) = 2 \text{ soc } 2\pi t - \sqrt{2}$. From (1) and (2), we have for $T = 1$, that $W = 1$, $\omega_o = 2\pi$, $M = 1$, $N = 3$ and $c_m = c_1 = c_{-1} = 1$, $c_o = -\sqrt{2}$. The zeros of this signal can be evaluated analytically using from the roots of $s'(Z) = Z^{-1} - \sqrt{2} + Z$. Its zeros are $Z_i = 1/\sqrt{2} + j/\sqrt{2}$ and $1/\sqrt{2} - j/\sqrt{2}$. Using the relation $Z_i = \exp(j2\pi \xi_i)$, the $\xi_i$'s are 1/8 and 7/8. Since the $\xi_i$'s are real, $\xi_i = t_i = 1/8, 7/8$ are the actual axis crossing zeros of $s(t)$. Since the number of real zero crossings = $2WT = 2$, these real zeros are adequate to represent the signal. Working backwards, $s(t)$ can be reconstructed from $t_i$'s using (3) as $$s(t) = 2^2 |1| \sin\pi(t - 1/8) \sin\pi(t - 7/8)$$
$$= 2 \cos 2\pi t - \sqrt{2}.$$

Also, the Fourier coefficients are determined by comparing the powers of Z in $s'(Z)$ given by (2) and (4). That is $$\frac{s'(Z)}{1} = Z^{-1} [Z - e^{j2\pi(1/8)}] [Z - e^{j2\pi(7/8)}]$$
$$= Z^1 + \frac{C_o}{1} Z^o + \frac{C_{-1}}{1} Z^{-1}$$

which results in $$c_o = -\sqrt{2} \text{ and } c_{-1} = c_1 = 1.$$

Since $S(k) = Nc_k$, the DFT coefficients are $S(1) \ 3$, $S(0) = -3\sqrt{2}$, and $S(-1) = 3$. These results should be compared to those obtained using (6), where $1/66 = 2W + 1/T = 3$.

3. Conversion of Complex Zeros to Real Zeros

From the above discussion, it can be seen that the DFT can be evaluated from zero crossings only if they all are real and single. Only if there are 2WT real zero crossings in the interval T, is the procedure valid. Unfortunately, most lowpass signals possess both real and complex zeros. Thus the number of real zeros will be less than 2WT, the dimensionality of the signal. Fortunately, there exist several techniques to convert a signal into one which has only real zeros. It can be shown that a sufficient condition for a signal to have only real and single zeros is that the analytic function of $s(\xi)$ be maximum phase, i.e., all the zeros of the analytic function have to be strictly in the upper half of the complex Z-plane. The analytic function of $s(\xi)$, assuming $s(t)$ is periodic and band-limited as per (1) is $$a(\xi) = \frac{C_o}{2} + \sum_{m=1}^{M} C_m e^{jm\omega_o \xi}$$

Making the transformation $Z = e^{j\omega_o \xi}$, then $a(\xi)$ becomes $$A(Z) = \frac{C_o}{2} + \sum_{m=1}^{M} C_m Z^m.$$

The maximum phase condition is now equivalent to requiring A(Z) to have all its zeros inside the unit circle. Note that in the simple example given previously $A(Z) = -1/\sqrt{2} + Z$ whose lone zero is at $Z = 1/\sqrt{2}$. Hence, A(Z) has all its zeros within the unit circle which is sufficient to guarantee that s(t) will have only real and simple zeros. To show that the maximum phase condition is not necessary, consider the following example:

$$Z^2 s'(Z) = (Z^2 - 2\cos\psi_1 Z + 1)(Z^2 - 2\cos\psi_2 Z + 1).$$

The zeros of this polynomial are on the unit circle at $Z = e^{+j\psi_1}, e^{+j\psi_2}$ and hence the zeros of s(t) are real and simple. Multiplying the factors, then $$Z^2 s'(Z) = Z^4 - 2(\cos\psi_1 + \cos\psi_2)Z^3 + 2(1 + 2\cos\psi_1\cos\psi_2)Z^2 - 2(\cos\psi_1 + \cos\psi_2)Z + 1$$

so that $$A(Z) = 1 + 2\cos\psi_1\cos\psi_2 - 2(\cos\psi_1 + \cos\psi_2)Z + Z^2$$

Now let $\psi_1 = \pi/3$, $\psi_2 = \pi/4$, $A(Z) = 1 + 1/\sqrt{2} - (1 + \sqrt{2})Z + Z^2$ which has zeros at $Z = 1.3\ e^{\pm j1.18}$. In order for A(Z) to have all its zeros within the unit circle, the sequence of $\{c_o/2, c_1, ..., c_M\}$ should have most of its energy near the end, i.e., toward $c_M$. Since $c_M$ describes the frequency content of the signal, one would expect any conversion of the original signal into one which processes all real simple zeros to involve increasing the high-frequency energy of the signal. Based on this principle, two methods have been suggested. Both methods preserve the bandwidth, but increase the high frequency content of the signal. The first method employs successive differentiation (or differencing as an approximation) for conversion and then restores the original signal by corresponding integrations. Since differentiation is not strictly invertible because of the loss of additive constants, this method is not preferred. A more accurate method adds a sine wave of frequency equal to or greater than the highest frequency present and of sufficiently large amplitude. The addition of a large amplitude sinusoid results in a sine wave with jittered zero crossings. The information about the original signal s(t) is contained in the displacements of the zeros from the uniformly spaced zero crossings of a sinusoid. Employing the latter approach, the composite signal can be expressed as $$x(t) = s(t) + A\cos 2\pi\left(W + \frac{1}{T}\right)t;\ -\frac{T}{2} \leq t \leq \frac{T}{2}$$

where $$A > \max_{-T/2 \leq t \leq T/2} |s(t)|.$$

It is easy to show that x(t) will have 2(WT+1) zeros in the interval $\{-T/2, T/2\}$. This is equivalent to showing that x(t) has exactly one zero crossing in each of the subintervals of length $1/\{2(W+1/T)\}$. (Notice that the sampling rate has to be modified for the composite signal). This follows as $$x(0) = s(t) + A\cos 2\pi\left(W + \frac{1}{T}\right)t\bigg|_{t=0}$$

$$= s(0) + A > 0$$

but $$x\left(\frac{1}{[2(W + 1/T)]}\right) = s\left(\frac{1}{[2(W + 1/T)]}\right) - A < 0$$

Since x(t) changes sign, there has to be at least one zero crossing of x(t) in $\{0, 1/(2(W+1/T))\}$. Thus, since the added sinusoid is periodic with period $1/(W+1/T)$ the pattern repeats, and there is a minimum of 2(WT+1) zeros in the interval T. However, the polynomial x'(Z) is of degree 2(WT+1) and can have no more than 2(WT+1) roots. This implies that all zeros of x(t) are real.

In practice, A could be chosen based on the power in s(t) and knowledge of the peak/rms ratio. Too large a value for A would result in zero crossings which are only slightly displaced from the zero crossing of the sinusoid. This suggests that zero crossing locations would be difficult to accurately measure. Hence, the value of A chosen should not greatly exceed the peak signal voltage.

The transformed signal x(t) can be expressed in the complex exponential form as $$x(t) = \sum_{m=-(M+1)}^{M+1} C_m e^{jm\omega_o t}$$

where $$C_{M+1} = C_{-(M+1)} = A/2.$$

Thus we will be detecting the 2M+2 zero crossings of the polynomial (see (4))

$$x'(Z) = C_{M+1} Z^{-(M+1)} \prod_{i=1}^{2(M+1)} (Z - e^{j\omega_o t_i}) \quad (7)$$

and using them to find the coefficients of $$x'(Z) = \sum_{m=-(M+1)}^{M+1} c_m Z^M$$

and finally the DFT coefficients from (5). The original signal can be recovered if desired, by subtracting out the added sinusoid from the reconstructed signal given by (3). If $x_1(t)$ and $s_1(t)$ are the reconstructed versions of x(t) and s(t), respectively, then from (3)

$$x_1(t) = 2^{2(M+1)}\left(\frac{A}{2}\right)^{2M+2} \prod_{i=1}^{} \left[\sin\frac{\omega_o}{2}(t - t_i)\right] \quad (8)$$

and $$s_1(t) = x_1(t) - A\cos 2\pi\left(W + \frac{1}{T}\right)t.$$

FIG. 2a-2d illustrate the zero extraction procedure and the computation of the DFT from the zero crossings. The signal s(t) of period T=1 s. (FIG. 2(a)) is composed of 3 sinusoids and a d.c. term. Although 2M =2WT =8, only 6 real zero crossings are present. In order to convert the signal to one with all real zero crossings, a sinusoid of amplitude A =8 at a frequency W+1/T=5 Hz is added. A is chosen such that it is greater than the sum of the amplitudes of the sinusoids and d.c. term of s(t). The resultant signal x(t) (FIG. 2(b)) has 10 real zero crossings. Since 2(W+1/T) equals 10, the zero locations of x(t) are sufficient to preserve all the information about x(t). FIG. 2(c) is a plot of S(k), the DFT coefficients of s(nΔ) as computed by (6) with N=9 and Δ=1/9. FIG. 2(d) is a plot of X(k), the DFT coefficients of x(nΔ) computed from the zero crossings of x(t) using (7) and (5) with N=11. Identical values of S(k) and X(k) for k= −4,...,0,...,4, verify the validity of the method.

4. Efficient Computation of DFT Coefficients From Zero Crossings

The algorithm for evaluating the DFT coefficients from zero crossings as per (7) amounts to determining the coefficients of a trigonometric polynomial for its zeros. Equation (7) may be rewritten as $$x'(Z) Z^{(M+1)} = a_0 \prod_{i=1}^{L} (Z - Z_i) \qquad (9)$$

$$= a_0 Z^L + a_1 Z^{L-1} + \ldots + a_{L-1} Z + a_L$$

where $a_0 = A/2$, $L = 2(M+1)$ and $a_i$'s are coefficients of $Z^{L-i}$, $i = 1, 2, \ldots, L$.

Hence the Fourier coefficients are related to $a_i$'s as $$C_i = a_{M+1-i}, \; i = -(M+1),\ldots,0,\ldots,M+1. \qquad (10)$$

A method for determining the $a_k$ coefficients of the polynomial from its zeros is now described.

Since the measurement of zero crossing times is a sequential process, it is profitable to compute the DFT coefficients sequentially. Higher degree polynomials can be recursively computed from its previous lower degree polynomial and the newly obtained zero crossing time by using the following algorithm.

Let $$P_k(Z) = \prod_{i=1}^{k} (Z - Z_i),$$

$$= Z^k + \sum_{i=1}^{k} a_i^{(k)} Z^{k-i}$$

Now $$P_{k+1}(Z) = (Z - Z_{k+1}) P_k(Z)$$

$$= Z^{k+1} + (a_1^{(k)} - Z_{k+1})Z^k +$$

$$(a_2^{(k)} - Z_{k+1} a_1^{(k)}) Z^{k-1} + \ldots +$$

$$(a_k^{(k)} - Z_{k+1} a_{k-1}^{(k)})Z - a_k^{(k)} Z_{k+1}$$

$$= Z^{k+1} + \sum_{i=1}^{k} (a_i^{(k)} - Z_{k+1} a_{i-1}^{(k)}) Z^{k+1-i} -$$

-continued
$a_k^{(k)} Z_{k+1}$.

Thus, the coefficients of $P_{k+1}(Z)$ can be evaluated from $Z_{k+1}$ and the coefficients of $P_k(Z)$ using the recursion $$a_0^{(k)} = 1 \qquad (11)$$

$$a_i^{(k+1)} = a_i^{(k)} - Z_{k+1} a_{i-1}^{(k)}, \; i = 1, 2, \ldots, k$$

$$= -Z_{k+1} a_k^{(k)}, \; i = k + 1.$$

Now $P_L(Z)$ is the desired polynomial given by (8). Since $(k+1)$ multiplications are needed to go from k-th stage to (k+1)-th stage, the total number of multiplications required is $$\sum_{k=1}^{L} (k + 1) \approx \frac{L^2}{2}.$$

It should be noted that no use has been made of the unity magnitude condition of the zeros.

5. Functional and Block Diagrams of the Zero Crossing Based Spectrum Analyzer FIG. 3 depicts a functional block diagram of its zero crossing based spectrum analyzer. The incoming signal s(t) is band-limited to W Hz and observed over the interval $-T/2 \leq t \leq T/2$ so that WT is an integer. The band-limited signal is added to the oscillator signal A cos {2Π(W+1/T)t}, the zeros found and then the $C_m$'s computed.

FIG. 4 illustrates in block diagram form the components of the zero crossing based spectrum analyzer indicated generally at 10. Band-limiting of the incoming signal s(t) is performed by an anti-aliasing filter 12 of bandwidth W Hz. The output signal from anti-aliasing filter 12 is inputted to summing amplifier 14 together with the sinusoidal signal from oscillator 16.

The sinusoidal oscillation cos {2Π(W+1/T)t} is synchronized with a high-speed clock 18 which runs at a rate $2(W+1/T)2^B$ Hz where B is the number of bits used. The B-bit counter 20 is started at the instant the cosine wave reaches its maximum or minimum. A zero crossing detector 22 outputs a pulse to the control unit 24 whenever x(t) crosses zero. Each time a zero crossing is detected, the contents of the counter 20 are latched by latch 26 and the counter reset. Simultaneously, processor 28 is urged to read the latched value through a processor interrupt. Thus, the occurrence of a zero crossing is measured relative to the instants the cosine wave reaches its maxima and minima; the measured interval can at most be equal to the average zero crossing interval 1/(2W+2/T), and hence make the optimum use of the number of bits.

The processor 28 upon interrupt stores the latched value $t_{k+1}$ and then continues its computation of the polynomial coefficients (as per equation (11) with $Z_{k+1} = e^{j\omega_0 t_{k+1}}$) until it is interrupted again. When all the 2WT+2 zero crossings in the interval T are made available, the processor can complete the computation of the DFT coefficients as per equation (10) and the results can be displayed on display 30.

Having described in detail a preferred embodiment of my invention, it will now be apparent to those skilled in the art that numerous modifications can be made therein without departing from the scope of the invention as defined in the following claims:

What I claim is:

1. A zero crossing based spectrum analyzer comprising:
    band-limiting means for band-limiting an input signal s(t) to a bandwidth of W Hz where the input signal is present over an interval $-T/2 \leq t \leq T/2$ so that WT is an integer, said band-limiting producing a band-limited output signal;
    oscillator means for producing an oscillator output signal and having a frequency $f = W + 1/T$ and an amplitude A such that $A > \max|s(t)| -T/2 \leq t \leq T/2$;
    adding means for adding said band-limited output signal and said oscillator output signal, said adding means producing an output signal x(t);
    zero crossing detector means for detecting each zero crossing of the output signal x(t) and producing an output pulse in response thereto;
    means responsive to the output pulses from said zero crossing detector means for converting the zero crossing into the DFT coefficients.

2. The zero crossing based spectrum analyzer of claim 1 wherein the means responsive to output pulses from the zero crossing detector means includes counter means for connecting pulses from a clock means synchronized with the oscillator means, with the counter means starting at the instants the oscillator output signal reaches it maxima or minima, latch means for latching the counter means as each detected zero crossing and resetting the counter means; and processor means for reading the latch value of the counter means in response to a detected zero crossing.

3. A method for determining the Discrete Fourier Transform coefficients of a signal containing only real zeros, said method comprising the steps of:
    adding to said signal the output signal from a sinusoid oscillator;
    detecting the zero crossings of the combined signal; and
    determining the DFT coefficients from said combined signal.

4. The method of claim 3 further comprising the steps of:
    band-limiting a signal and converting the band-limited signal into another signal having only real zeros, said another signal being then added to said output signal from the sinusoidal oscillator.

* * * * *